United States Patent
Ohsaka

(10) Patent No.: US 7,277,298 B2
(45) Date of Patent: Oct. 2, 2007

(54) MULTI-TERMINAL DEVICE AND PRINTED WIRING BOARD

(75) Inventor: Tohru Ohsaka, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 57 days.

(21) Appl. No.: 11/237,508

(22) Filed: Sep. 27, 2005

(65) Prior Publication Data

US 2006/0065965 A1    Mar. 30, 2006

(30) Foreign Application Priority Data

Sep. 28, 2004   (JP)   ............... 2004-282484
Sep. 9, 2005    (JP)   ............... 2005-262986

(51) Int. Cl.
*H05K 7/00*     (2006.01)
(52) U.S. Cl. ............... 361/760; 174/260; 439/608
(58) Field of Classification Search ............... 361/760, 361/792–795; 174/255, 260, 262; 439/698
See application file for complete search history.

(56) References Cited

U.S. PATENT DOCUMENTS 6,235,997 B1 *   5/2001   Asada et al. ............... 174/260

FOREIGN PATENT DOCUMENTS

JP   2000-349192   12/2000

* cited by examiner

*Primary Examiner*—Javaid H. Nasri
(74) *Attorney, Agent, or Firm*—Morgan & Finnegan, LLP

(57) ABSTRACT

According to the invention, even when high-speed differential signal pins are arranged on the inner side of a BGA, they can be wired on a printed wiring board at a low cost. In a multi-terminal device (1) having one surface where a large number of connection terminals are arrayed planarly, terminals (3) that need not be electrically connected individually are arranged between differential signal terminals (2) of the multi-terminal device and the periphery of the multi-terminal device.

10 Claims, 13 Drawing Sheets

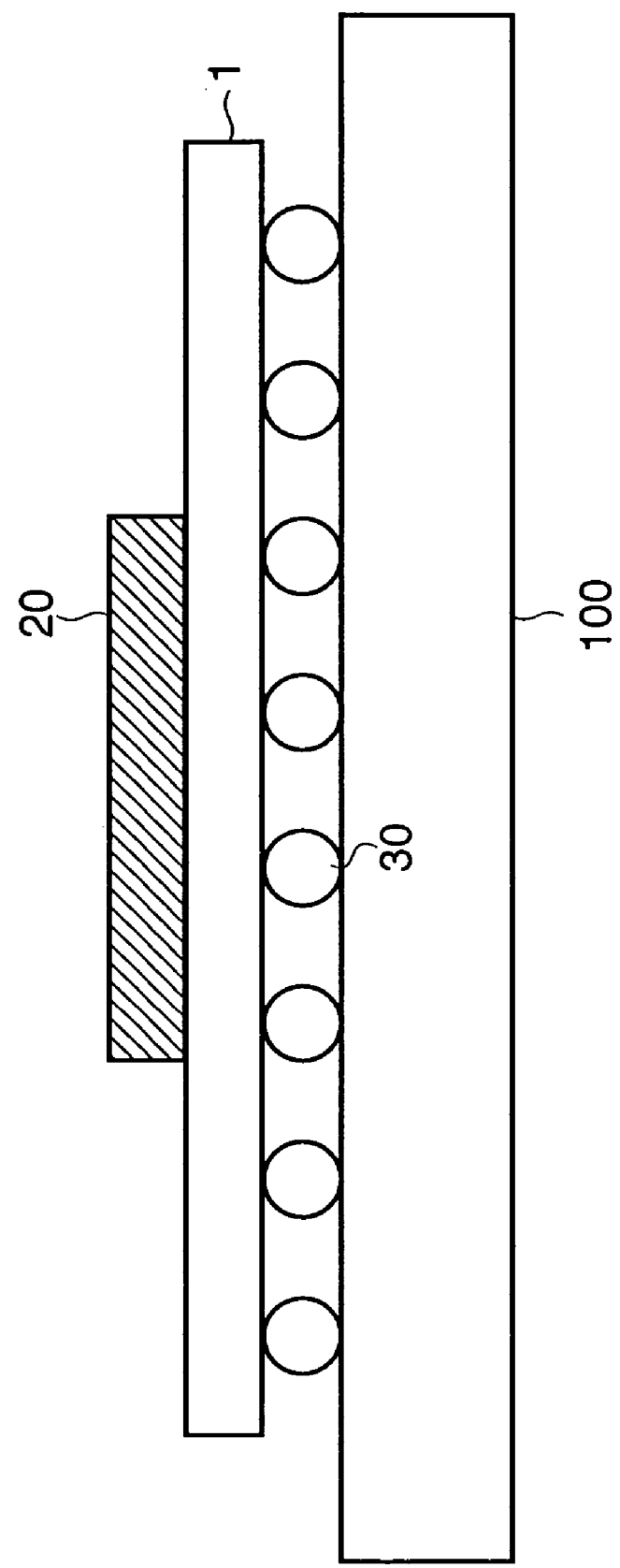

MULTI-TERMINAL DEVICE AND PRINTED WIRING BOARD

CLAIM OF PRIORITY

This application claims priority from Japanese Patent Application No. 2004-282484 filed on Sep. 28, 2004 and No. 2005-262986 filed on Sep. 9, 2005, the entire contents of which are hereby incorporated by reference herein.

FIELD OF THE INVENTION

The present invention relates to a technique for mounting a multi-terminal semiconductor apparatus on a printed wiring board and, more particularly, to a technique for mounting on a printed wiring board a multi-terminal device in which a large number of terminals are arrayed planarly.

BACKGROUND OF THE INVENTION

In recent years, external I/Fs (InterFaces) such as USB or IEEE 1394 are mounted on an electronic device represented by a personal computer. The external I/Fs decrease the number of signal lines (bus width) and transmit high-speed signals having pulse widths corresponding to a frequency of several hundred MHz to ensure the band width. The external I/Fs use low-amplitude differential signals as low as about several ten 10 mV to ensure such high speed and noise-resistant ability. On a printed wiring board in the device, the high-speed I/F signals are transmitted by signal lines which are matched to the differential impedances complying the respective I/F standards. This aims at avoiding decrease in signal quality caused by the reflection or attenuation of the differential signals on the printed wiring board.

The differential signal wiring patterns require at least two dedicated GND (Ground) wiring patterns that are differential-impedance matched. Accordingly, the two differential signal wiring patterns and two GND wiring patterns must be extended in one path to increase the wiring pattern width of the signal group.

This will be exemplified by a case wherein a wiring pattern having a USB differential impedance of 90 Ω is extended in the first layer, the thickness of the insulating layer between the first layer and the second GND layer is 0.2 mm, and the dielectric constant is 4.5. When the width of this wiring pattern is calculated by a commercially available transmission path simulator, SPACE/LINE/SPACE/LINE/SPACE=300 μm+175 μm+125 μm+175 μm+300 μm=1,075 μm is obtained. In other words, the entire width of the wiring pattern group including the clearances at the two ends is about 1.0 mm. The minimal design value of the substrate at this time is calculated as L/S=0.125/0.125 mm.

To extend such a wiring pattern from BGA signal terminals assigned with signals at a 1.0-mm pitch without impedance mismatching, the differential signals must be assigned to the balls on the first to third arrays counted from the outer side.

If the differential signals are to be assigned to the balls from the fourth array, through hole lands on the first to third arrays which result from wiring pattern extension of other signals serve as an obstacle, and a 1.0-mm pitch signal line group cannot be arranged. For example, when the through hole land diameter is 0.6 mm and the through hole pitch is 1.0 mm, the distance between the through hole lands is 0.4 mm, and a 1.0-mm pitch signal line group cannot be arranged.

Japanese Patent Laid-Open No. 2000-349192 discloses a printed wiring board on which a BGA (Ball Grid Array) package is mounted. According to the method proposed by Japanese Patent Laid-Open No. 2000-349192, high-speed differential signals are assigned to the outermost pins to facilitate signal wiring pattern extension and avoid mutual interference with other signals.

In general, the length of a signal wiring pattern starts to adversely affect the waveform by causing reflection or the like where the time required by the signal to reciprocate on the path exceeds the signal rise time. Usually, the rise time of a trapezoidal wave is about 5% the signal period.

For example, when the frequency is 100 MHz, the period is 10 nsec, and the rise time is 0.5 nsec. When the region where the time required by the signal to reciprocate on the path exceeds the signal rise time is converted using a signal transmission speed of 0.006 nsec/mm on a general FR4 substrate, the corresponding reciprocal length is 0.5/0.006=83.3 mm. The one-way length is 83.3/2=about 42 mm. Namely, impedance mismatching of a path with a length of 42 mm or more largely, adversely affects the waveform quality.

The wiring pattern density on an interposer substrate which forms a BGA package is high unlike on the printed wiring board, and accordingly it is very difficult to form an impedance-matched wiring pattern on the interposer substrate. The length of one side of a generally widely used BGA package is 50 mm or less, and the maximal distance from the center is about 35 mm (a length half the diagonal line). Hence, regarding the wiring pattern length that can be an issue, the wiring pattern on the interposer substrate is sufficiently short, and conventionally no problem arises as far as the wiring pattern length on the printed wiring board is considered.

As the signal speed increases, however, the frequency increases, and a signal having a frequency corresponding to 500 MHz or more cannot but be employed.

When the calculation described above is done for the frequency of 500 MHz, the wiring pattern length that causes a problem in signal reflection is 8 mm. Namely, impedance mismatching of a path with a length of 8 mm or more largely adversely affects the waveform quality.

As the wiring pattern width on the interposer which does not conventionally cause any problem is becoming to largely, adversely affect the waveform quality, the high-speed differential signal pins cannot but be assigned on the inner side of the BGA. In this case, however, it is difficult to extend a wiring pattern from a terminal on the printed wiring board. Accordingly, to extend the wiring pattern while maintaining the waveform quality, an expensive IVH circuit board or build-up wiring board must be used, which is a significant problem.

SUMMARY OF THE INVENTION

The present invention has been made in view of the above problems, and has as its object to enable high-speed differential signal pins to be wired on a printed wiring board at a low cost even when the signal pins are arranged on the inner side of a BGA.

In order to solve the above problems and to achieve the above object, according to the first aspect of the present invention, there is provided a multi-terminal device in which a large number of connection terminals are arrayed in a matrix and which has at least one pair of adjacent differential signal terminals, wherein of the large number of connection terminals arrayed in the matrix, a connection terminal which is on the same column as one of the differential signal terminals and located on an outer peripheral side of one of the differential signal terminals comprises an electrical non-connection terminal.

According to the second aspect of the present invention, there is provided a multi-terminal device in which a large number of connection terminals are arrayed in a matrix and which has at least one pair of differential signal terminals, wherein of the large number of connection terminals arrayed in the matrix, connection terminals which are on the same column as one of the differential signal terminals and located on an outer peripheral side of one of the differential signal terminals have a same potential.

According to the third aspect of the present invention, there is provided a printed wiring board on which a multi-terminal device having a large number of connection terminals including at least one pair of differential signal terminals is to be mounted and which has not less than two wiring layers, wherein connection lands corresponding to the connection terminals of the multi-terminal device are formed in a matrix on a first wiring layer, and differential signal wiring patterns which are wired from, of the connection lands, differential signal lands corresponding to the differential signal terminals are wired, in a wiring layer which is different from the first wiring layer, under a land which is located on an outer peripheral side of the differential signal lands and which is not to be connected electrically.

According to the fourth aspect of the present invention, there is provided a printed wiring board on which a multi-terminal device having a large number of connection terminals including at least one pair of differential signal terminals is to be mounted and which has not less than two wiring layers, wherein connection lands corresponding to the connection terminals of the multi-terminal device are formed in a matrix on a first wiring layer, and differential signal wiring patterns which are wired from, of the connection lands, differential signal lands corresponding to the differential signal terminals are wired, in a wiring layer which is different from the first wiring layer, under lands which have a same potential, and are located on an outer peripheral side of the differential signal lands and connected to each other.

Other objects and advantages besides those discussed above shall be apparent to those skilled in the art from the description of a preferred embodiment of the present invention which follows. In the description, reference is made to accompanying drawings, which form a part hereof, and which illustrate an example of the invention. Such example, however, is not exhaustive of the various embodiments of the invention, and therefore reference is made to the claims which follow the description for determining the scope of the invention.

BRIEF DESCRIPTION OF THE DRAWINGS

FIG. 1A is a perspective view of a case wherein a BGA component according to an embodiment of the present invention is mounted on a printed wiring board;

DETAILED DESCRIPTION OF THE PREFERRED EMBODIMENT

Figure 1B:
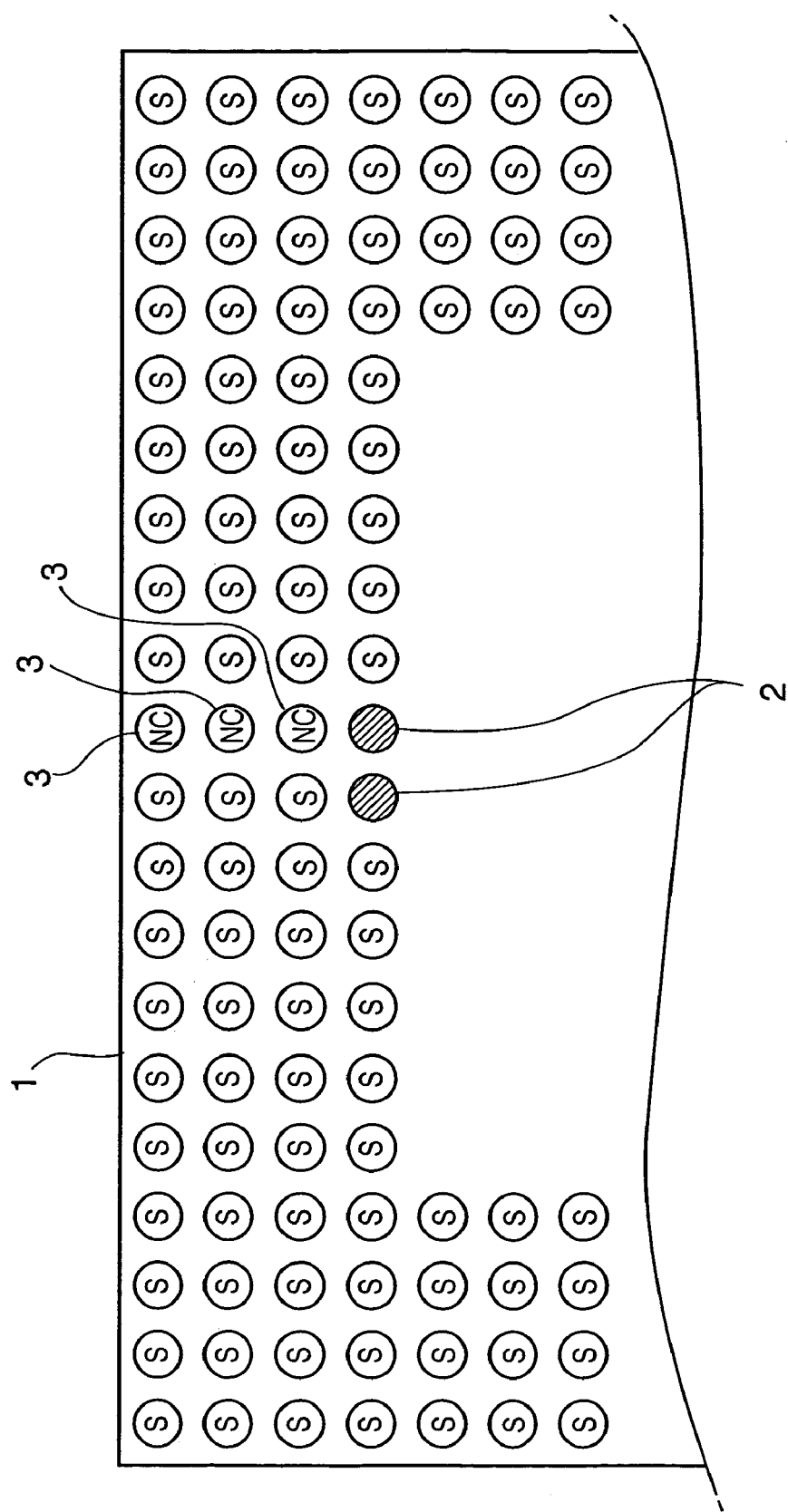
FIG. 1B is a schematic view, seen through from the upper surface, of the BGA (Ball Grid Array) component according to the embodiment of the present invention to show the terminal layout.

A preferred embodiment of the present invention will be described in detail with reference to the accompanying drawings.

FIG. 1A is a perspective view of a case wherein a BGA component according to an embodiment of the present invention is mounted on a printed wiring board. Referring to FIG. 1A, reference numeral 20 denotes an IC chip 20; and 1, an interposer substrate on which the IC chip 20 is mounted. The BGA component comprising the interposer substrate 1 on which the IC chip 20 is mounted is mounted on a printed wiring board 100 through solder balls 30.

FIG. 1B is a schematic view, seen through from the upper surface, of the BGA (Ball Grid Array) component according to the embodiment of the present invention to show the terminal matrix layout. The BGA component is a peripheral type component having terminals on its periphery.

Referring to FIG. 1B, reference numeral 1 denotes the interposer substrate of about a half size. Reference numerals 2 denote differential signal terminals. A differential signal requires two terminals. Terminals 3 between the differential signal terminals 2 and a side closest to the differential signal terminals 2 are assigned to NC terminals (electrical non-contact terminals) in this embodiment. The terminals 3 are connection terminals which are on the same column as one differential signal terminal 2 and located on the outer peripheral side of the differential signal terminal 2 it. Other signal terminals, power supply terminals, and GND terminals are indicated by S to distinguish them from the terminal group that characterizes this embodiment. In the following description, in addition to a terminal that need not be actually wired, terminals that need not be wired individually, like equipo tential terminals such as the GND terminals to be described later, will also be referred to as NC terminals hereinafter. The terminals that need not be wired individually refer to those that can be wired by only the first signal wiring layer without using the second signal wiring layer of the printed wiring board (to be described later). The pads on the printed wiring board which correspond to the NC terminals will be referred to as NC pads hereinafter.

Figure 2:
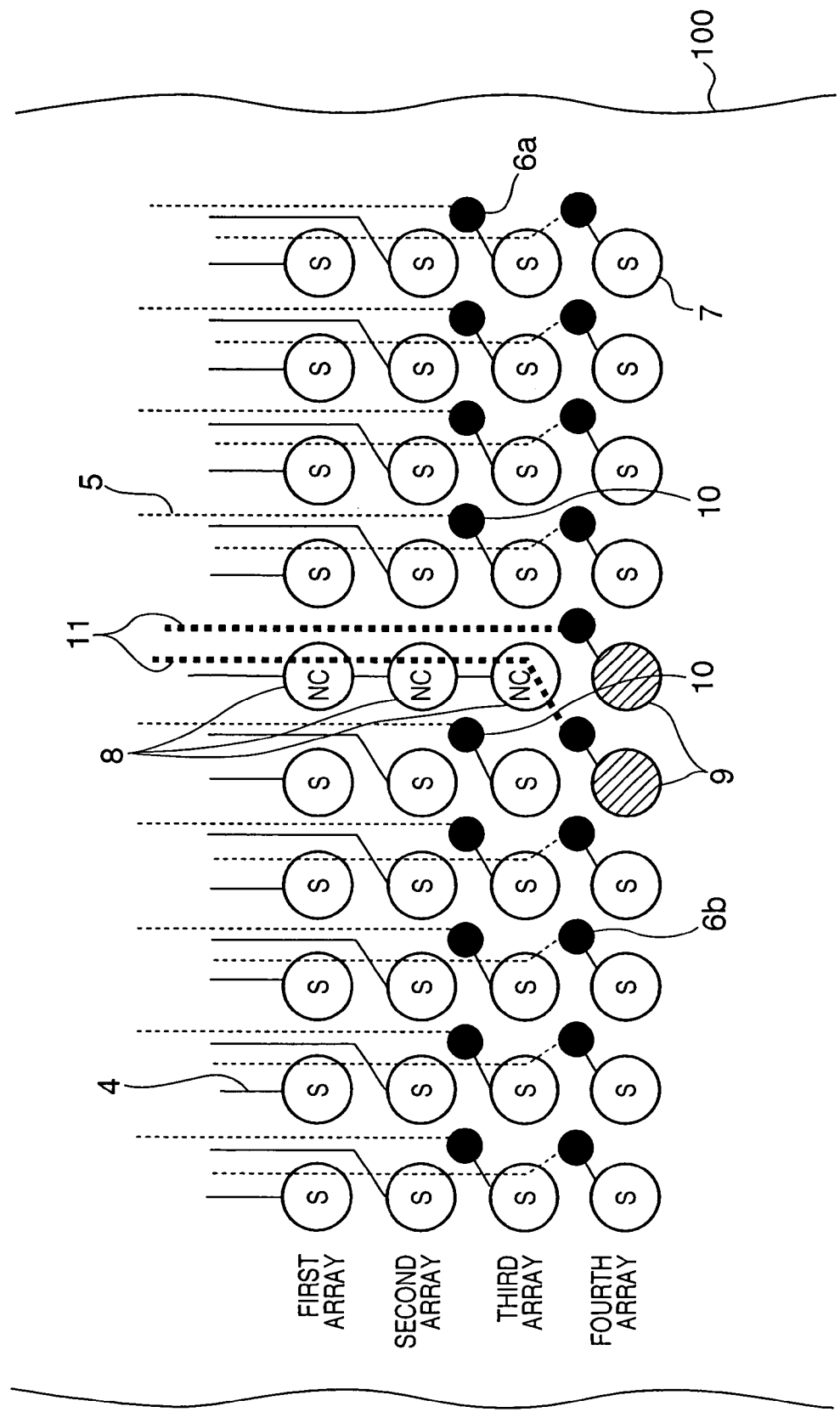
FIG. 2 is a see-through schematic view of the signal wiring layers of the printed wiring board, where the BGA component shown in FIG. 1B is to be mounted, to show a portion near differential signal pads in enlargement.
Figure 3:
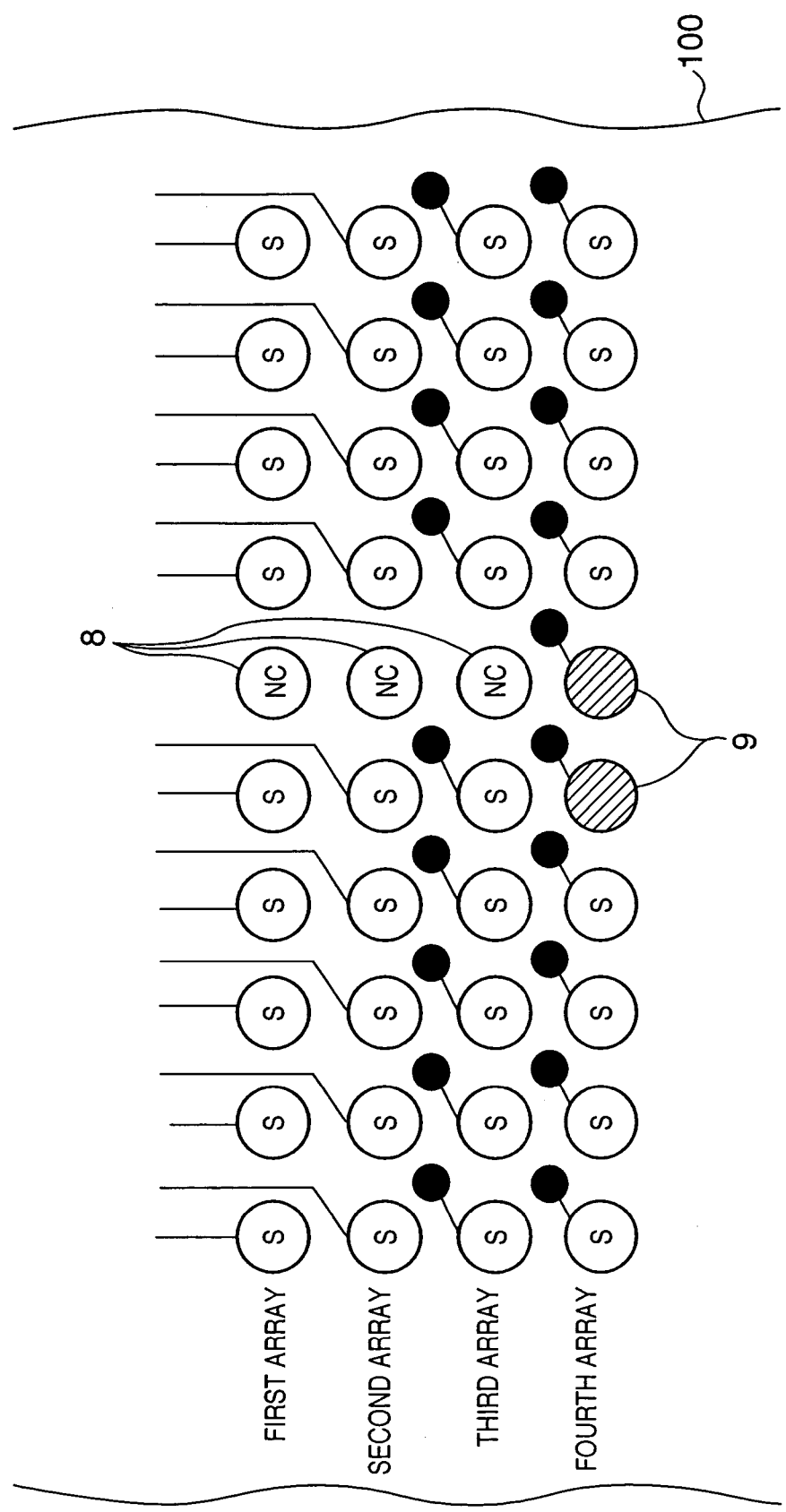
FIG. 3 is a schematic view of only the first wiring layer of the printed wiring board of FIG. 2.
Figure 4:
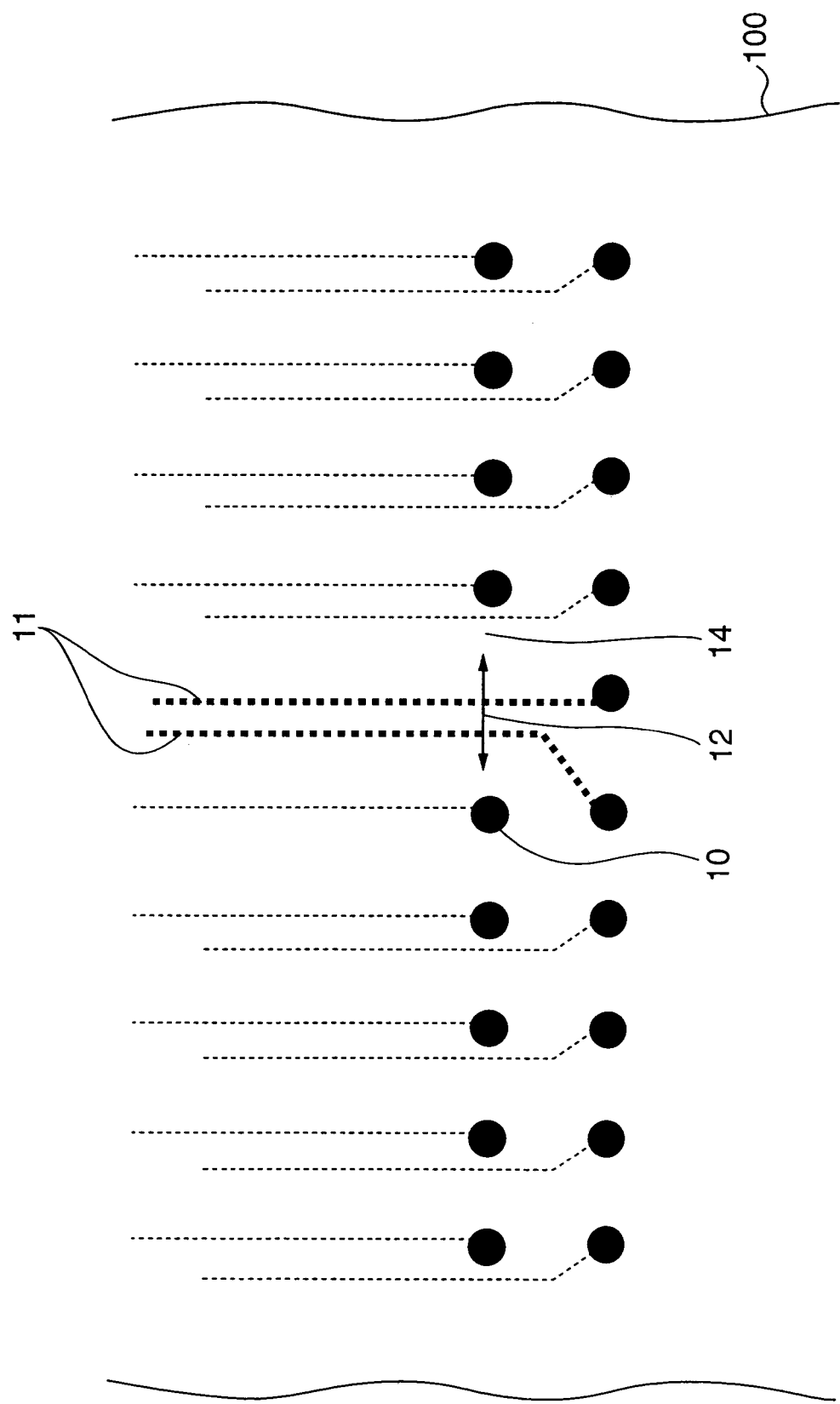
FIG. 4 is a schematic view of only the second signal wiring layer of the printed wiring board of FIG. 2.

FIG. 2 is a see-through schematic view of the signal wiring layers of the printed wiring board, where the BGA component according to this embodiment shown in FIG. 1B is to be mounted, to show a portion near the differential signal terminals in enlargement, FIG. 3 is a schematic view of only the first wiring layer of the printed wiring board of FIG. 2, and FIG. 4 is a schematic view of only the second signal wiring layer.

FIGS. 2 to 4 show some of the pads mounted on the BGA component and wire extension on the printed wiring board 100. In this case, wire extension of all the terminals shown in the drawings is described.

As the printed wiring board, a four-layer board is assumed. Two surface layers in the four-layer board having two, a power supply layer and GND layer, constitute the signal wiring layers, and are called the first and second signal wiring layers, respectively. The layer where the BGA component is mounted is the first signal wiring layer. The wiring pattern of the first signal wiring layer is indicated by a solid line 4, and the wiring pattern of the second signal wiring layer is indicated by a broken line 5. The through holes and through hole lands are indicated by full circles.

The pitches of BGA mount pads 7 of the printed wiring board are set to such a size that one signal wiring pattern can extend through each pitch. Hence, as shown in the drawings, the signals of the connection terminals on the first and second arrays counted from the peripheral BGA pads can be wired by the first signal wiring layer.

As no wiring path is provided in the first signal wiring layer for the signals of the third array, the signals of the third array must be wired by the second signal wiring layer through through holes 6a. As the through holes are arranged between the pads, the through hole pitches are almost equal to the BGA pitches.

Differential signal terminal pads 9 arranged on the fourth array are also to be wired by the second signal wiring layer through through holes 6b, and must be wired between the through holes 6a arranged for third array signal extension. As described above, as the through holes are arranged between the pads, the through hole pitches are almost equal to the BGA pitches. Hence, usually only one signal line can extend between two adjacent pads. In other words, differential signal wiring patterns cannot be extended parallel to each other.

In view of this, in FIG. 2, an NC (electrical non-connection) pad group 8 which does not require through holes is formed at those positions of the printed wiring board which correspond to the NC terminals 3 of the BGA component. As the pad group 8 need not be electrically connected, its wiring patterns need not be extended to the second signal wiring layer through through holes. In other words, the gaps among the through holes enlarge by at least one pitch under the NC pad group 8 in the second signal wiring layer. Differential signal wiring patterns 11 having a wiring width based on a desired impedance are arranged easily by using the pitch-enlarged portion.

The width of the differential signal wiring patterns can be calculated easily from the line impedance and the sizes and physical properties of the respective layers by a commercially available transmission path simulator or electromagnetic simulator. Thus, the width of the differential wiring pattern group having a desired impedance can be obtained.

In this embodiment, the width of the region of the second signal wiring layer where the differential wiring pattern group is wired is determined by the gap from the through hole land close to the differential wiring pattern group and/or another signal wiring pattern. In FIG. 4, the width of the region where the differential wiring pattern group can be arranged is determined by a gap 12 between a through hole land 10 and another signal wiring pattern 14. This gap can be enlarged by increasing the number of columns of the NC pad group 8 of this embodiment. When the number of columns of the NC pad group of this embodiment is increased, a wiring pattern for a differential wiring pattern group having any width can be arranged with a desired impedance in the second signal wiring layer.

The NC terminal group can be an equipotential terminal group such as GND equipotential or power supply equipotential terminals. In the case of the equipotential terminal group, the equipotential terminals are wired by the first signal wiring layer.

Although the present invention is exemplified by a peripheral type BGA, it can also be a full-matrix type BGA or a peripheral type BGA having terminals at its central portion as well.

Practical examples will be described.

EXAMPLE 1

Figure 5:
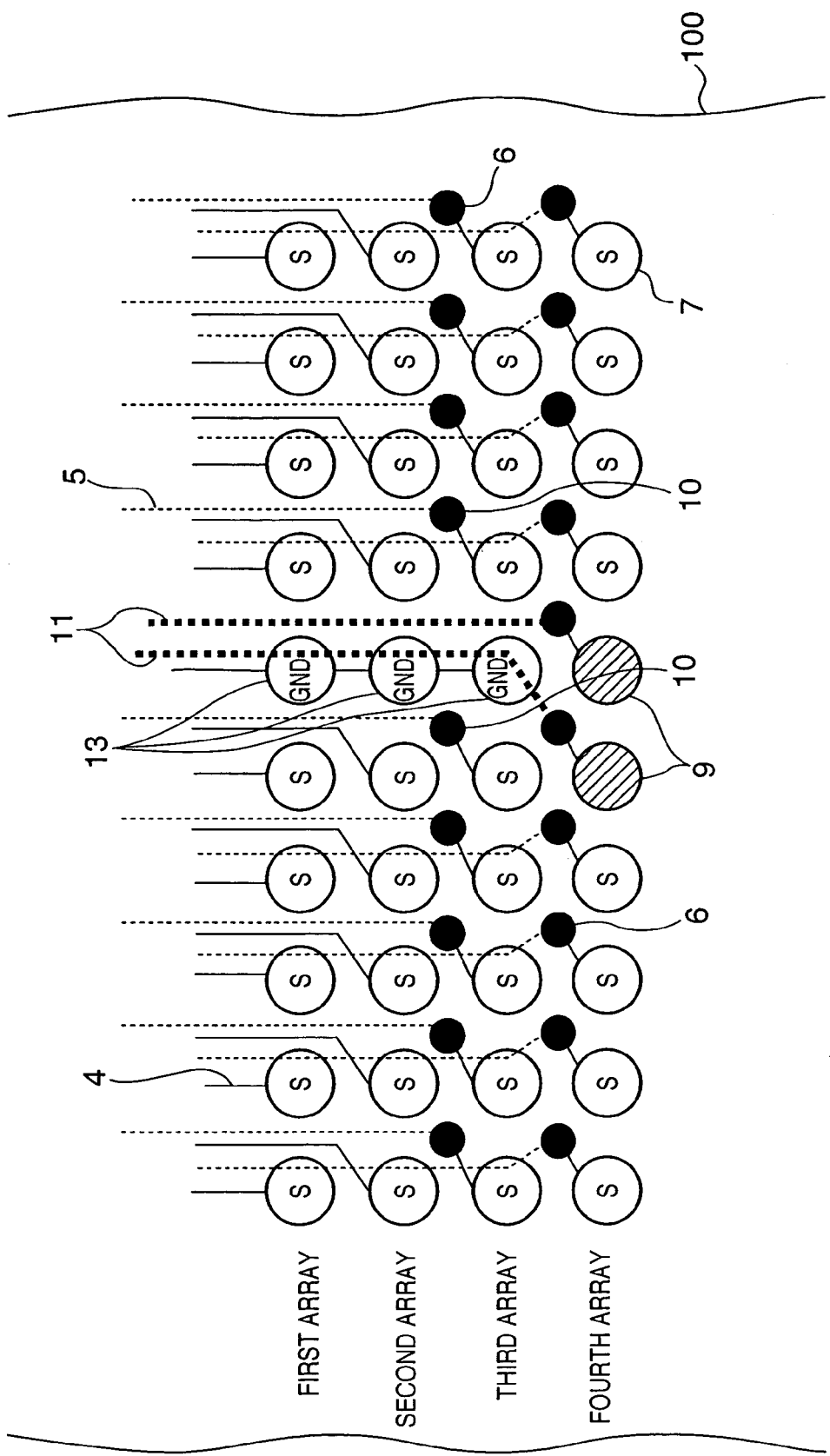
FIG. 5 is a see-through schematic view of the signal wiring layers of a printed wiring board of a case wherein the NC terminal group of a BGA component is assigned to equipotential GND potential terminals.
Figure 6:
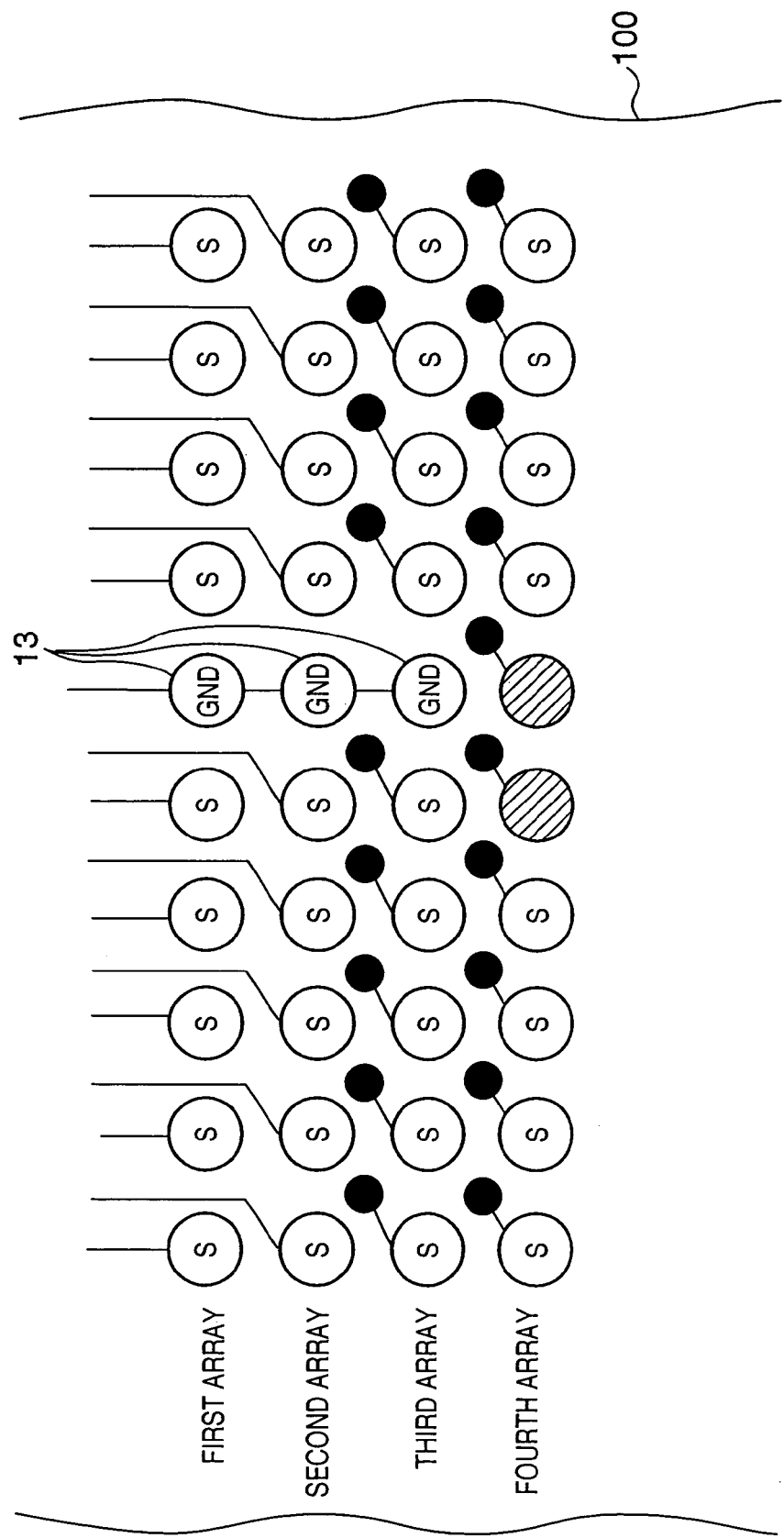
FIG. 6 is a schematic view, seen from the upper surface, of only the first wiring layer of the printed wiring board of FIG. 5.
Figure 7:
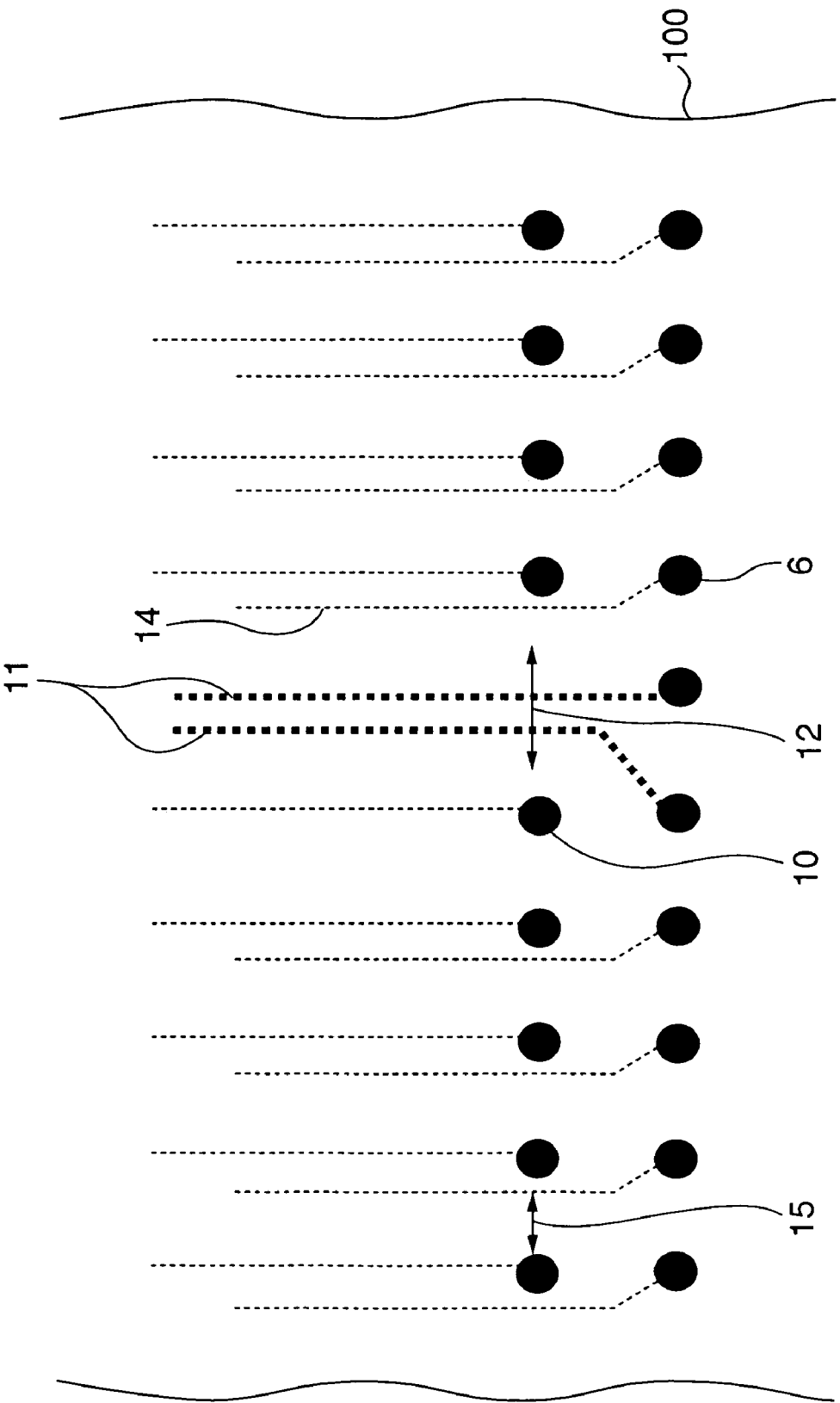
FIG. 7 is a schematic view, seen from the upper surface, of only the second wiring layer of the printed wiring board of FIG. 5.

FIG. 5 is a see-through schematic view of the signal wiring layers of a printed wiring board of a case wherein the NC terminal group of a BGA component is assigned to equipotential GND potential terminals, to show a portion near the differential signal terminals in enlargement. FIG. 6 is a schematic view of only the first wiring layer of the printed wiring board of FIG. 5, and FIG. 7 is a schematic view of only the second wiring layer of the printed wiring board of FIG. 5.

BGA connection pads 7 have diameters of 0.5 mm and pitches of 1.0 mm. Through hole lands 6 have diameters of 0.6 mm. The minimal L/S of the wiring pattern is 0.125/0.125 mm. The distance between the BGA connection pads is (ball pitch)−(half the diameter of connection pad)−(half the diameter of connection terminals), that is, $$1-(0.5/2)-(0.5/2)=0.5 \text{ mm}$$

Hence, only one wiring pattern can extend if its L/S is 0.125/0.125 mm. Accordingly, the wiring patterns of the connection pads on the inner side of the third array must be arranged in the second signal wiring layer through through holes.

A method of wiring pads 9 to which the differential signal terminals are to be connected is the same as that described in the above embodiment.

As is apparent from FIG. 6, three connection pads (NC pads) 13 to which equipotential terminals are to be connected are equipotential, and are accordingly respectively connected to each other with wiring patterns by the first signal wiring layer and extended. Particularly, the pads on the third array which originally require through holes are also wired without using any through holes.

As is apparent from FIG. 7, differential signal wiring patterns 11 are arranged in a region where the through hole lands 6 are eliminated due to the presence of the NC pad group 13 which does not require any through holes.

Assuming that the differential impedance is 90 Ω and that the physical properties, i.e., an insulating layer thickness and dielectric constant, of the printed wiring board are 0.2 mm and 4.5, respectively, the wiring pattern width of the differential signal wiring patterns 11 is calculated by a commercially available transmission path simulator to obtain SPACE/LINE/SPACE/LINE/SPACE=300 μm+175 μm+125 μm+175 μm+300 μm=1,075 μm Thus, the entire width including the clearances is 1.075 mm.

The wiring pattern region of the differential signal wiring patterns 11 is narrowest at a portion 12. The portion 12 corresponds to a gap between a through hole land 10 and a signal wiring pattern 14 extended from the fourth array.

This gap is expressed by:

(BGA pad pitch×2)−(radius of left through hole land)−(radius of right through hole land)−clearances−(wiring pattern width of signal wiring pattern 14)

More specifically, this gap is (1.0×2)−0.3−0.3−0.125−0.125=1.15 mm. Differential signal wiring patterns having a width of 1.075 mm can be wired without impedance mismatching. If this embodiment is not employed, as the gap indicated by reference numeral 15 which is between a through hole land and the signal wiring pattern is 0.15 mm, the differential signal wiring patterns may not be wired, or an impedance mismatching portion may occur.

As described above, according to this embodiment, differential signal wiring patterns having a desired impedance can be arranged on the printed wiring board without increasing the number of wiring layers.

EXAMPLE 2

Figure 8:
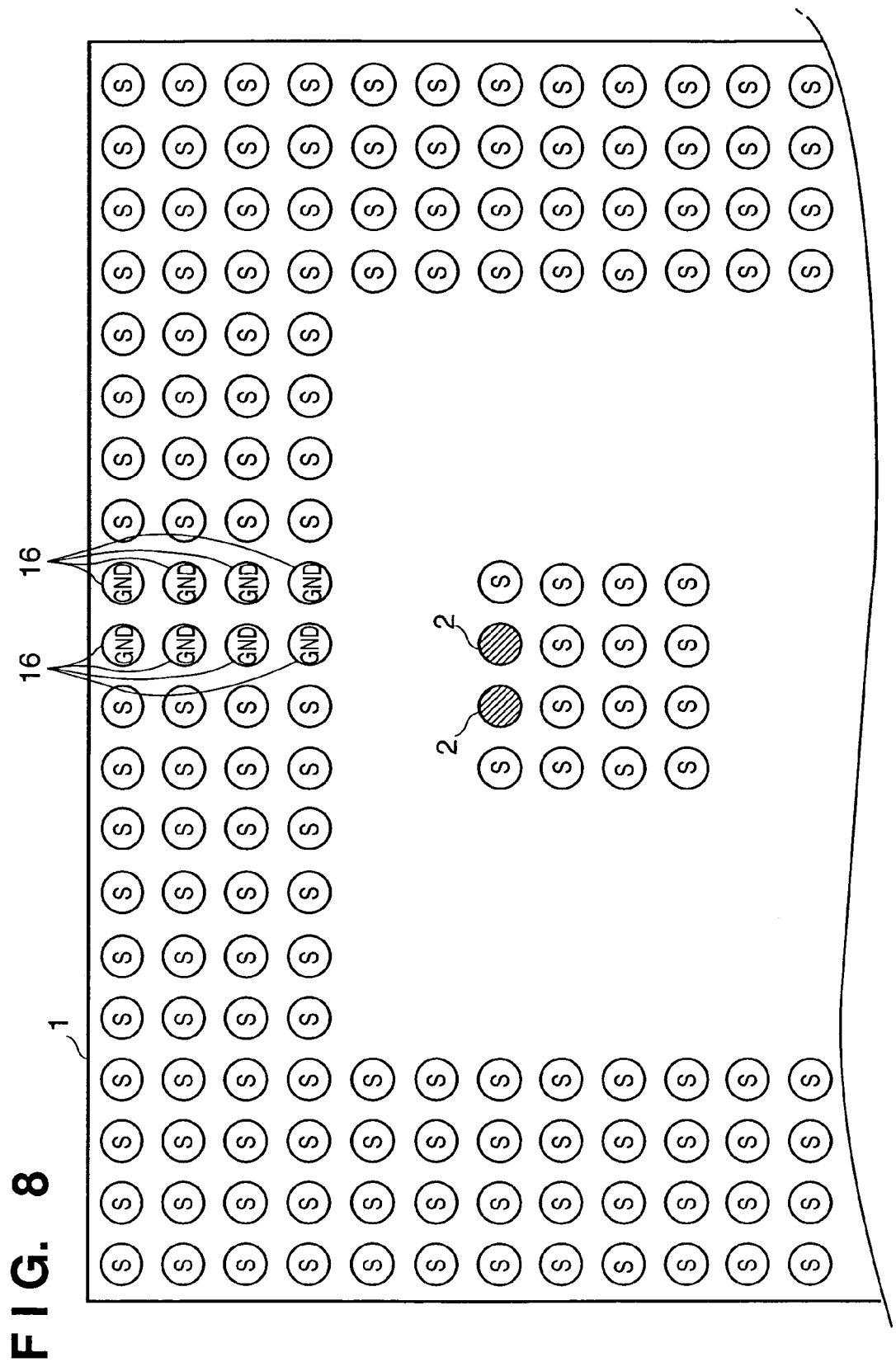
FIG. 8 is a schematic view, seen through from the upper surface, of a BGA component in which equipotential terminals (GND potential terminals) as NC terminals are assigned to a peripheral type BGA which has terminals at its central portion as well, to show the terminal layout.

FIG. 8 is a schematic view, seen through from the upper surface, of a BGA component in which equipotential terminals (GND potential terminals) as NC terminals are assigned to a peripheral type BGA which has terminals at its central portion as well, to show the terminal layout.

Differential signal terminals 2 are present at the terminal positions of the central portion, and. offset from equipotential pads 16 as the NC terminals. Two columns of equipotential pads 16 are provided.

Figure 9:
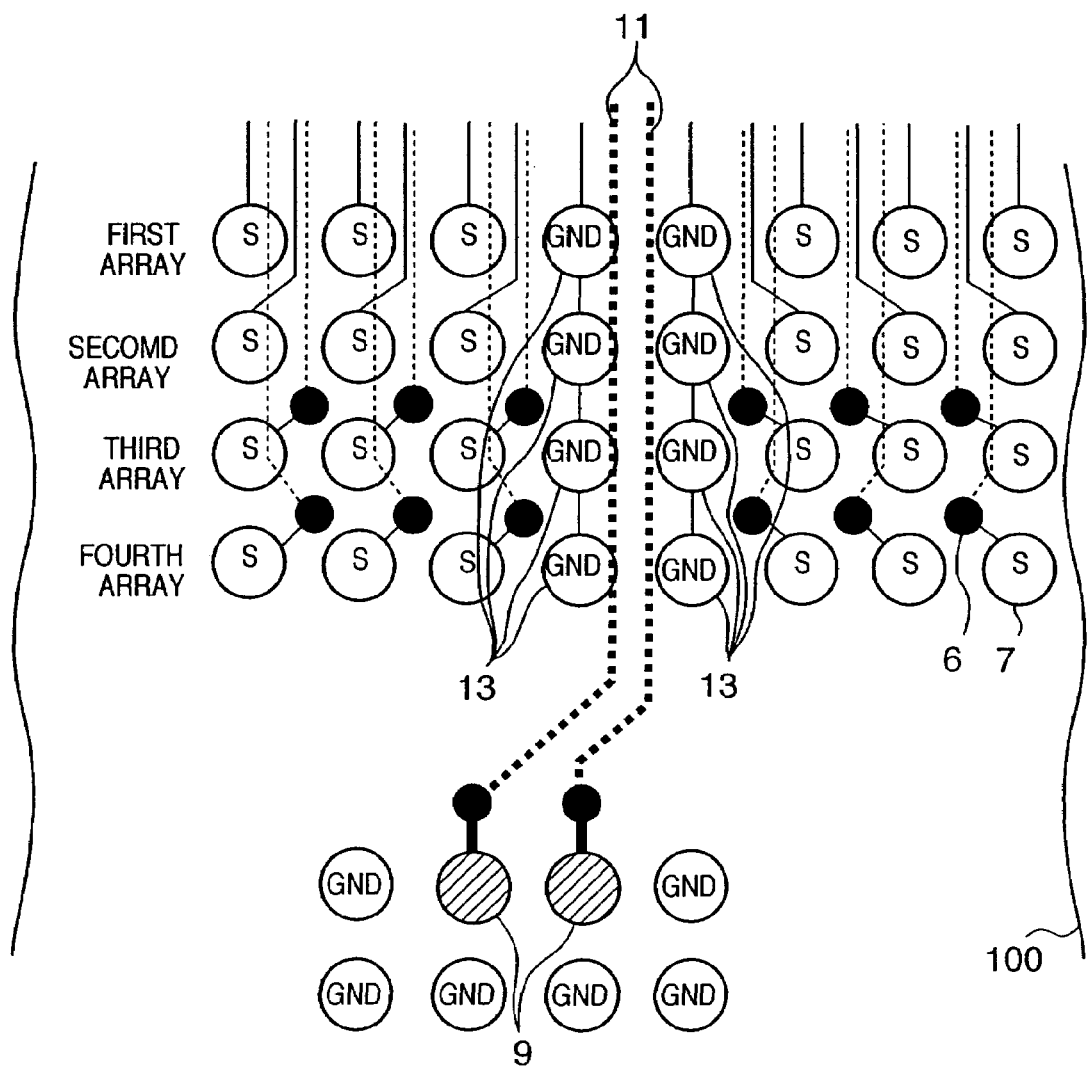
FIG. 9 is a see-through schematic view of the signal wiring layers of a printed wiring board, where a BGA component in which a NC terminal group is assigned to equipotential GND potential terminals is mounted, to show a portion near differential signal terminals in enlargement.
Figure 10:
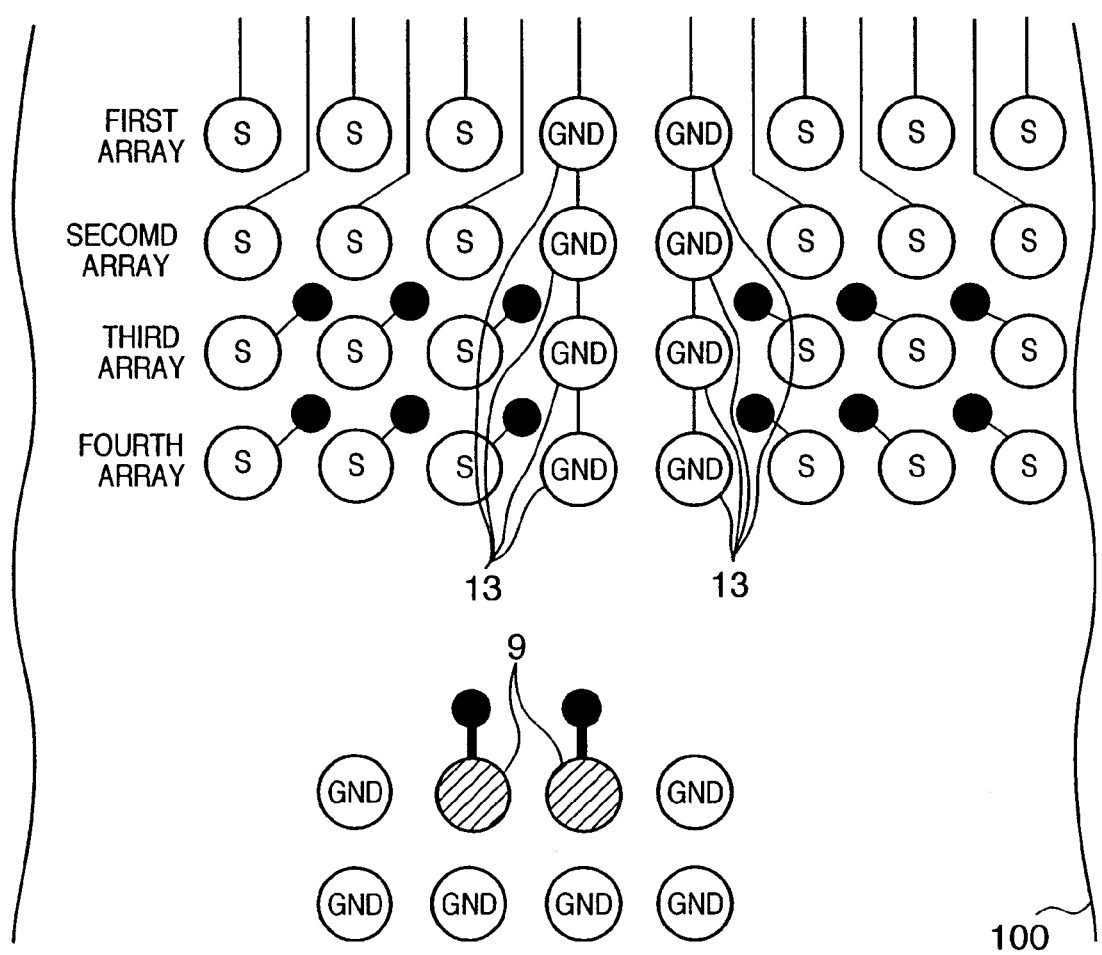
FIG. 10 is a schematic view, seen from the upper surface, of only the first wiring layer of the printed wiring board of FIG. 9.

FIG. 9 is a see-through schematic view of the signal wiring layers of a printed wiring board, where a BGA component in which a NC terminal group is assigned to equipotential GND potential terminals is mounted, to show a portion near differential signal terminals in enlargement. FIG. 10 is a schematic view of only the first wiring layer of the printed wiring board of FIG. 9, and FIG. 11 is a schematic view of only the second wiring layer of the printed wiring board of FIG. 9.

Equipotential pads 13 as the NC pads are GND connection pads, and are arranged at positions offset from differential signal terminals 9. According to the design rule, BGA mount pads 7 have diameters of 0.5 mm and pitches of 1.0 mm, through hole lands 6 have diameters of 0.6 mm, and the minimal wiring pattern L/S is 0.125/0.125 mm, in the same as in Example 1. Therefore, the distance between the BGA mount pads is 0.5 mm, which is the same as in Example 1. The wiring patterns from connection pads on the inner side of the third array must be arranged in the second wiring layer through through holes.

Referring to FIG. 10, eight connection pads (NC pads) 13 to which equipotential terminals as the NC terminals are to be connected are equipotential, and are accordingly connected to each other with wiring patterns by the first wiring layer and extended. In particular, the pads on the third and fourth arrays which originally need through holes are also wired without using any through holes.

Figure 11:
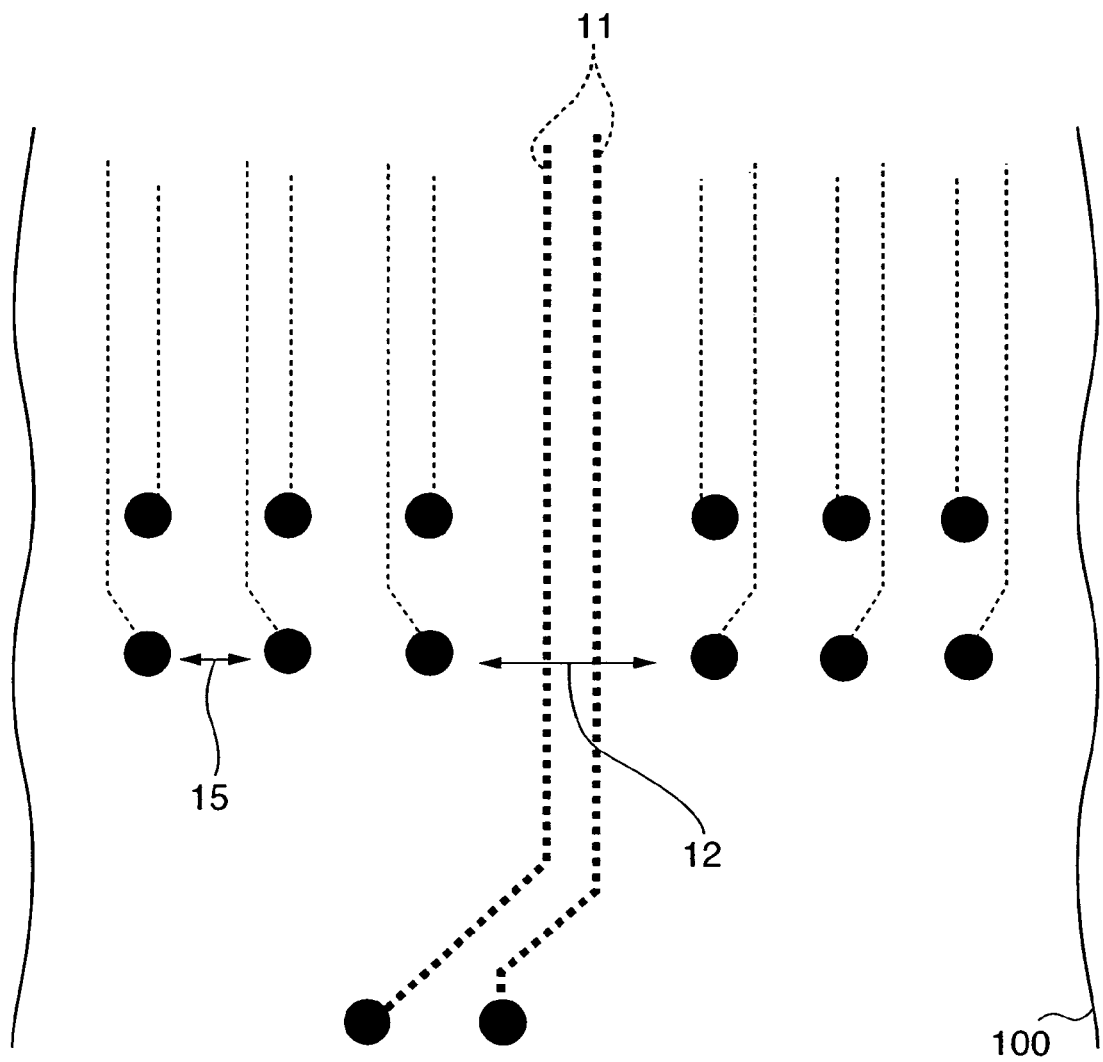
FIG. 11 is a schematic view, seen from the upper surface, of only the second wiring layer of the printed wiring board of FIG. 9.

Referring to FIG. 11, a distance 12 between through hole lands which are adjacent to the equipotential terminal pads as the NC pads and formed for extending wiring patterns from the connection pads on the third and fourth arrays is expressed by:

(BGA pad pitch×2)−(radius of left through hole land)−(radius of right through hole land)

More specifically, the distance 12 is (1.0×2)−0.3−0.3=1.4 mm. Therefore, a differential signal line group having a width of 1.4 mm or less can be arranged without impedance mismatching. If no NC pads are used, the allowed width of the wiring pattern group corresponds to a gap 15, which is 0.4 mm. The differential signal wiring patterns cannot be arranged in the gap 15.

Figure 12:
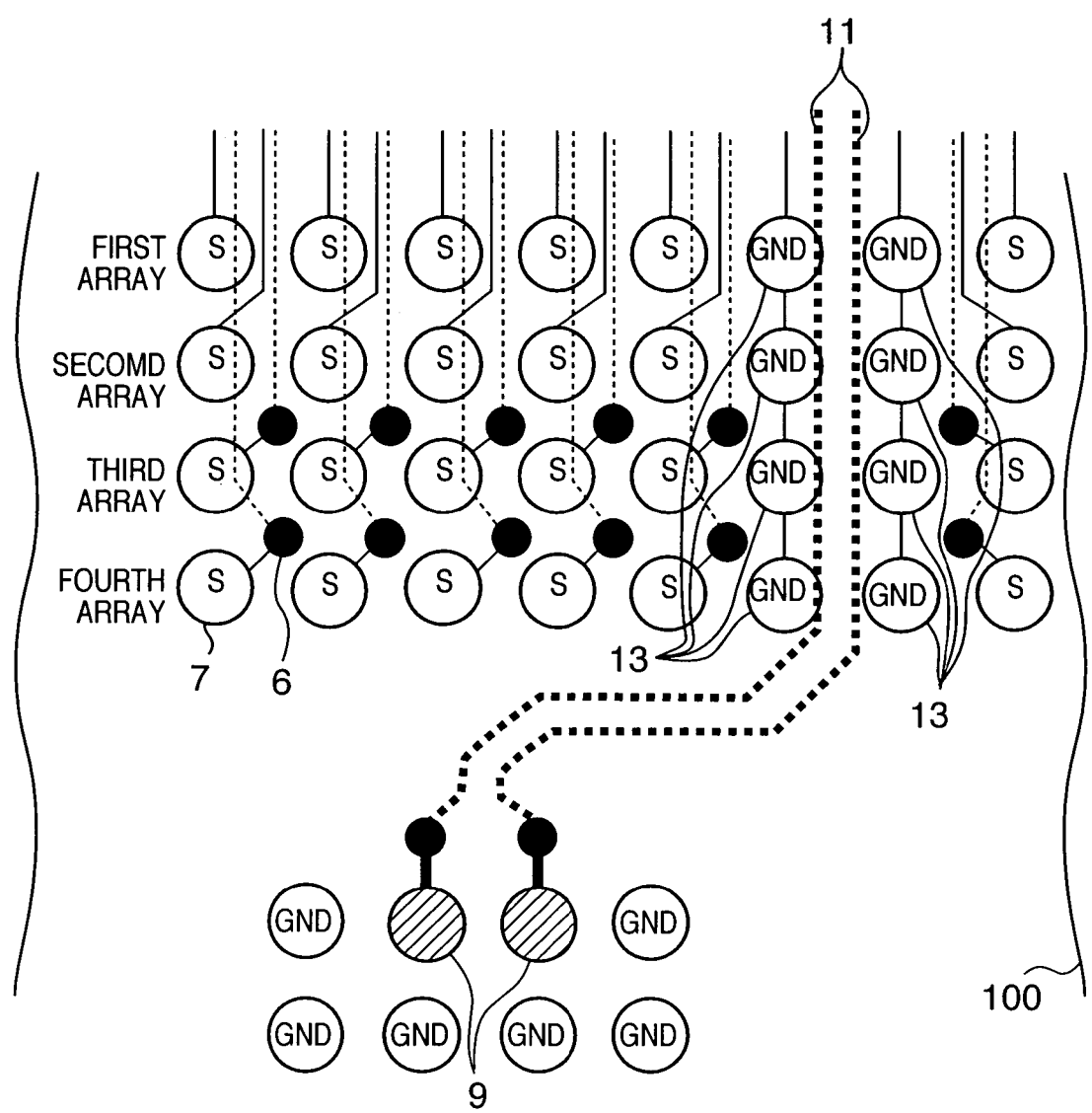
FIG. 12 is a view showing the printed wiring board in which the differential signal terminals and NC pad group are offset more than in the cases shown in FIGS. 10 and 11.

The differential signal terminals 9 (2 on the BGA component) and the NC pad group 8 (NC terminals 3 on the BGA component) may be on one straight line, or offset from each other within a range where they can be wired. FIG. 12 shows a printed wiring board in which the differential signal terminals 9 and NC pad group 8 are offset more than in the cases shown in FIGS. 10 and 11.

As has been described above, according to the present invention, in a multi-terminal device having a bottom surface where a large number of connection terminals are arrayed planarly, if differential signal terminals are arranged on the inner side of "(the number of signal lines that can be extended between pads)+2" when counted from the outer side of the nearest side, pads to which the differential signal terminals of the BGA component are to be connected and at least one column of connection pad group which is present between the differential signal pads and the nearest side are formed as electrical non-connection (NC) pads or equipotential pads. Thus, on the printed wiring board having two or more wiring layers, through holes for the pads to which the differential signal terminals are to be connected and for the connection pad group between the differential signal terminals and the nearest side can be excluded. The region immediately under the NC pad group or equipotential pad group which can be wired by the second signal wiring layer can be enlarged. Thus, a multi-terminal device component and printed wiring board can be provided in which differential signals having a predetermined impedance can be wired easily with a small number of wiring layers.

The present invention is not limited to the above embodiments and various changes and modifications can be made within the spirit and scope of the present invention. Therefore, to apprise the public of the scope of the present invention the following claims are made.

What is claimed is:

1. A multi-terminal device in which a large number of connection terminals to be connected to a printed wiring board are arrayed in a matrix and which has at least one pair of adjacent differential signal terminals, wherein all of the connection terminals which are on the same column as one of said differential signal terminals and located on an outer peripheral side of said one of said differential signal terminals are electrical non-connection terminals.

2. A multi-terminal device in which a large number of connection terminals to be connected to a printed wiring board are arrayed in a matrix and which has at least one pair of adjacent differential signal terminals, wherein each connection terminals which are on the same column as one of said differential signal terminals and located on an outer peripheral side of said one of said differential signal terminals have a same potential.

3. The multi-terminal device according to claim 2, wherein said connection terminals which have a same potential comprise ground potential terminals.

4. The multi-terminal device according to claim 2, wherein said connection terminals which have a same potential comprise power supply potential terminals.

5. A printed wiring board on which a multi-terminal device having a large number of connection terminals including at least one pair of differential signal terminals is to be mounted and which has not less than two wiring layers, wherein connection lands corresponding to said connection terminals of said multi-terminal device are formed in a matrix on a first wiring layer which is faced with the multi-terminal device, and differential signal wiring patterns which are wired from adjacent differential signal lands corresponding to said differential signal terminals are wired, in a wiring layer which is different from said first wiring layer, under a land which is located on an outer peripheral side of said differential signal lands and which is not to be connected electrically.

6. The printed wiring board according to claim 5, wherein said land which is not to be connected electrically is located on the same column as one of said differential signal lands corresponding to said differential signal terminals and located on an outer peripheral side of said one of said differential signal lands.

7. The printed wiring board according to claim 5, wherein said land which is not to be connected electrically is arranged at a position offset from one of said differential signal lands corresponding to said differential signal terminals.

8. A printed wiring board on which a multi-terminal device having a large number of connection terminals including at least one pair of differential signal terminals is to be mounted and which has not less than two wiring layers, wherein connection lands corresponding to said connection terminals of said multi-terminal device are formed in a matrix on a first wiring layer which is faced with the multi-terminal device, and differential signal wiring patterns which are wired from, differential signal lands corresponding to said differential signal terminals are wired, in a wiring layer which is different from said first wiring layer, under the lands which have a same potential, and are located on an outer peripheral side of said differential signal lands and connected to each other.

9. The printed wiring board according to claim 8, wherein said lands which have a same potential comprise ground potential lands.

10. The multi-terminal device according to claim 8, wherein said lands which have a same potential comprise power supply potential lands.

* * * * *